United States Patent
Harada et al.

(10) Patent No.: US 9,748,132 B2
(45) Date of Patent: Aug. 29, 2017

(54) SUBSTRATE PROCESSING APPARATUS, METHOD FOR MANUFACTURING SEMICONDUCTOR DEVICE, METHOD FOR PROCESSING SUBSTRATES

(75) Inventors: Koichiro Harada, Toyama (JP); Noriaki Michita, Toyama (JP); Tatsushi Ueda, Toyama (JP); Takayuki Sato, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 13/427,281

(22) Filed: Mar. 22, 2012

(65) Prior Publication Data

US 2012/0252220 A1 Oct. 4, 2012

(30) Foreign Application Priority Data

Apr. 1, 2011 (JP) ................................. 2011-081469
Feb. 2, 2012 (JP) ................................. 2012-021225

(51) Int. Cl.
*C23C 16/00* (2006.01)
*H01L 21/687* (2006.01)
(Continued)

(52) U.S. Cl.
CPC .. *H01L 21/68742* (2013.01); *H01J 37/32715* (2013.01); *H01J 37/32724* (2013.01);
(Continued)

(58) Field of Classification Search
CPC ........ C23C 16/45544; C23C 16/68785; C23C 16/6875
(Continued)

(56) References Cited

U.S. PATENT DOCUMENTS 5,885,469 A * 3/1999 Kholodenko et al. .......... 216/11
5,902,403 A * 5/1999 Aitani et al. .................. 118/715
(Continued)

FOREIGN PATENT DOCUMENTS

JP A-2001-126995 5/2001
JP B2-3293801 6/2002
(Continued)

OTHER PUBLICATIONS

Dated May 14, 2013 Office Action issued in Korean Patent Application No. 10-2012-0014757 (with translation).
(Continued)

*Primary Examiner* — Gordon R Baldwin
*Assistant Examiner* — Charlee Bennett
(74) *Attorney, Agent, or Firm* — Oliff PLC

(57) ABSTRACT

A substrate supporting member provided in a processing chamber for processing the substrate and configured to support the substrate, has on its upper surface, a protruding area that supports an edge side of the substrate from below; a recessed area provided inside of the protruding area so as not to be brought into contact with the substrate supported by the protruding area; and an auxiliary protruding area formed lower than the protruding area and provided in the recessed area, and has a flow passage that is communicated with inside of the recessed area, for escaping gas between the substrate and the substrate supporting member from the recessed area side.

14 Claims, 8 Drawing Sheets

(51) Int. Cl.
  *H01J 37/32* (2006.01)
  *H01L 21/67* (2006.01)
  *H01L 21/68* (2006.01)
(52) U.S. Cl.
  CPC .. *H01J 37/32853* (2013.01); *H01J 37/32871* (2013.01); *H01L 21/67109* (2013.01); *H01L 21/67115* (2013.01); *H01L 21/67282* (2013.01); *H01L 21/68* (2013.01); *H01L 21/6875* (2013.01)
(58) Field of Classification Search
  USPC .......................... 118/728; 156/345.51–345.53
  See application file for complete search history.

(56) References Cited

U.S. PATENT DOCUMENTS

| | | | | |
|---|---|---|---|---|
| 6,267,839 | B1* | 7/2001 | Shamouilian | H01L 21/6833 361/234 |
| 6,627,560 | B1* | 9/2003 | Toshikawa | C23C 16/401 257/E21.261 |
| 6,840,767 | B2 | 1/2005 | Goodman | |
| 7,393,417 | B1* | 7/2008 | Maeda | C23C 16/4583 118/725 |
| 2002/0121342 | A1* | 9/2002 | Nguyen et al. | 118/715 |
| 2002/0134511 | A1* | 9/2002 | Ushioda et al. | 156/345.51 |
| 2003/0192647 | A1* | 10/2003 | Tamura | H01L 21/67109 156/345.51 |
| 2008/0318439 | A1* | 12/2008 | Ito et al. | 438/778 |
| 2009/0056112 | A1* | 3/2009 | Kobayashi | H02N 13/00 29/739 |
| 2009/0233443 | A1 | 9/2009 | Sasaki | |
| 2009/0253272 | A1* | 10/2009 | Terasaki | C23C 16/308 438/786 |
| 2010/0039747 | A1* | 2/2010 | Sansoni | H01L 21/6833 361/234 |
| 2010/0096262 | A1* | 4/2010 | Aruga | C23C 14/50 204/298.08 |
| 2011/0139070 | A1* | 6/2011 | Nabeta | H01J 37/32082 118/666 |

FOREIGN PATENT DOCUMENTS

| | | |
|---|---|---|
| JP | A-2004-128019 | 4/2004 |
| JP | A-2008-042023 | 2/2008 |
| JP | A-2010-153409 | 7/2010 |
| JP | 2011204709 A | 10/2011 |
| KR | A-10-2009-0024075 | 3/2009 |

OTHER PUBLICATIONS

Korean Office Action issued in Korean Patent Application No. 10-2012-0014757 dated Jan. 29, 2014 (w/ partial translation).
Dated Oct. 6, 2015 Office Action issued in Japanese Patent Application No. 2012-021225.

* cited by examiner

SUBSTRATE PROCESSING APPARATUS, METHOD FOR MANUFACTURING SEMICONDUCTOR DEVICE, METHOD FOR PROCESSING SUBSTRATES

BACKGROUND OF THE INVENTION

Technical Field

The present invention relates to a substrate processing apparatus, a method for manufacturing a semiconductor device, a method for processing substrates.

Description of Related Art

Manufacturing steps of a semiconductor device, for example, comprises a step of placing a substrate loaded into a processing chamber on a upper surface of a substrate supporting member, and applying prescribed processing to the substrate.

However, particles, etc., adhered to the upper surface of the substrate supporting member is sometimes adhered to a rear surface of the substrate for example, when the substrate is placed on the substrate supporting member. Further, air or gas is sometimes sandwiched between the substrate and the substrate supporting member for example, thus allowing the substrate to slide sideways.

SUMMARY OF THE INVENTION

An object of the present invention is to provide a substrate processing apparatus, a method for manufacturing a semiconductor device, and a method for processing a substrate, capable of suppressing adhesion of particles to a rear surface of a substrate placed on a substrate supporting member, and suppressing the sliding of the substrate sideways.

According to an aspect of the present invention, there is provided a substrate processing apparatus, comprising:

a processing chamber configured to process a substrate;

a substrate supporting member provided in the processing chamber and configured to support the substrate;

a gas supply section configured to supply processing gas into the processing chamber;

a gas exhaust section configured to exhaust inside of the processing chamber;

a plasma generating section configured to excite the processing gas supplied into the processing chamber; and a controller configured to control the gas supply section, the gas exhaust section, and the plasma generating section, wherein the substrate supporting member has on its upper surface, a protruding area for supporting an edge side of the substrate from below, and a recessed area provided inside of the protruding area so as not to be brought into contact with the substrate supported by the protruding area, and an auxiliary protruding area formed lower than the protruding area and provided in the recessed area, and a flow passage communicated into the recessed area, for flowing a gas between the substrate and the substrate supporting member from the recessed area side.

According to other aspect of the present invention, there is provided a method for manufacturing a semiconductor device, comprising:

loading a substrate into a processing chamber;

placing the substrate on a substrate supporting member while escaping a gas between the substrate and the substrate supporting member to a flow passage communicated with a recessed area, the substrate supporting member being provided in the processing chamber and having on its upper surface, a protruding area for supporting an edge side of the substrate from below and the recessed area provided inside of the protruding area so as not to be brought into contact with the substrate supported by the protruding area, and an auxiliary protruding area formed lower than the protruding area and provided in the recessed area;

supplying processing gas into the processing chamber by a gas supply section while exhausting the inside of the processing chamber by a gas exhaust section, and plasma-processing the substrate by exciting the processing gas supplied into the processing chamber by a plasma generating section; and unloading the substrate from the processing chamber.

According to further other aspect of the present invention, there is provided a method for processing a substrate, comprising:

loading a substrate into a processing chamber;

placing the substrate on a substrate supporting member while escaping a gas between the substrate and the substrate supporting member to a flow passage communicated with a recessed area, the substrate supporting member being provided in the processing chamber and having on its upper surface, a protruding area for supporting an edge side of the substrate from below and the recessed area provided inside of the protruding area so as not to be brought into contact with the substrate supported by the protruding area, and an auxiliary protruding area formed lower than the protruding area and provided in the recessed area;

supplying processing gas into the processing chamber by a gas supply section while exhausting the inside of the processing chamber by a gas exhaust section, and plasma-processing the substrate by exciting the processing gas supplied into the processing chamber by a plasma generating section; and unloading the substrate from the processing chamber.

According to further other aspect of the present invention, there is provided a susceptor cover that is attachable and detachable to/from a susceptor for supporting a substrate in a processing chamber for processing the substrate, comprising:

a protruding area configured to support a part of the substrate from below;

a recessed area disposed so as not to be brought into contact with the substrate supported by the protruding area; and an auxiliary protruding area formed lower than the protruding area and provided in the recessed area.

According to the present invention, there are provided a substrate processing apparatus, a method for manufacturing a semiconductor device, and a method for processing a substrate, and a susceptor cover, capable of suppressing adhesion of particles to a rear surface of a substrate placed on a substrate supporting member and suppressing the sliding of the substrate sideways.

BRIEF DESCRIPTION OF THE DRAWINGS

FIG. 2 is a schematic view showing a substrate supporting member provided in the substrate processing apparatus according to the first embodiment of the present invention, wherein FIG. 2A is a plane view of the substrate supporting member, and FIG. 2B is a cross-sectional view taken along the line A-A of the substrate supporting member.

FIG. 6 is a schematic view showing the substrate supporting member provided in the substrate processing apparatus according to a modified example of the first embodiment, wherein FIG. 6A is a plane view of the substrate supporting member, and FIG. 6B is a cross-sectional view taken along the line A-A of the substrate supporting member.

FIG. 7 is a view showing a substrate temperature rising characteristic in the substrate processing step according to example 3 of the present invention and a comparative example, wherein FIG. 7A is an event chart showing an implementation time of each event in the substrate processing step, and FIG. 7B is a graph showing the substrate temperature rising characteristic.

DETAILED DESCRIPTION OF THE INVENTION

Figure 1:
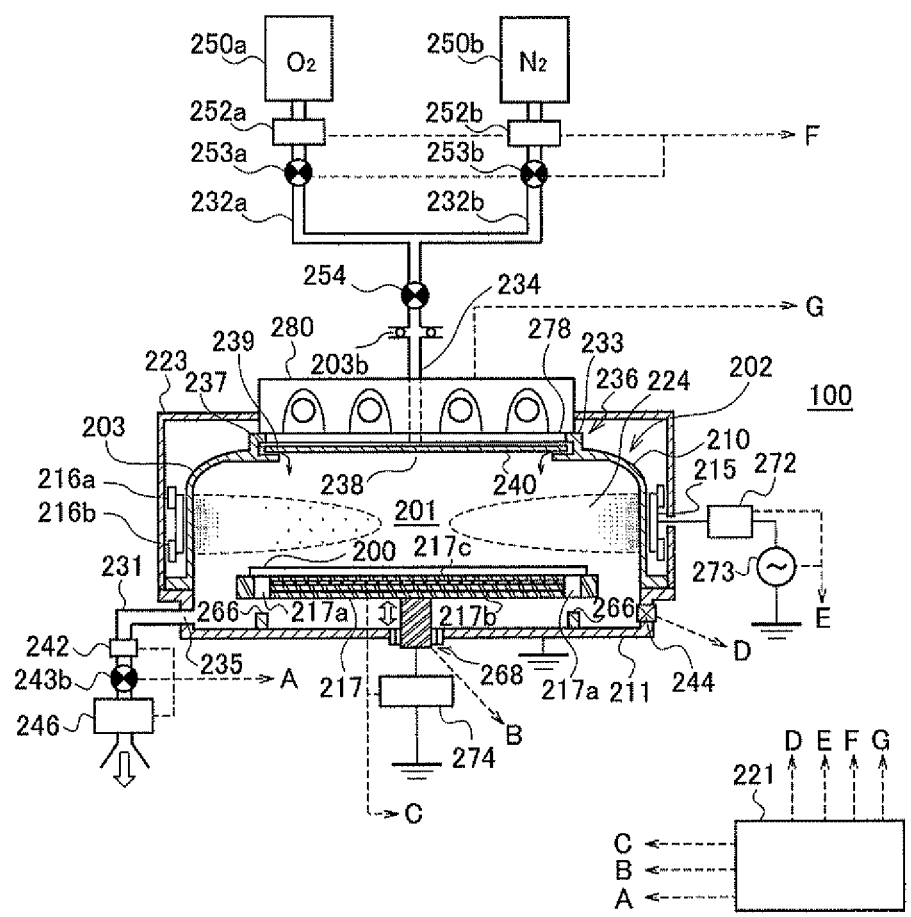
FIG. 1 is a cross-sectional view of a modified magnetron type plasma processing apparatus, being a substrate processing apparatus, according to a first embodiment of the present invention.

First Embodiment of the Present Invention (1) Structure of the Substrate Processing Apparatus A substrate processing apparatus according to a first embodiment of the present invention will be described using FIG. 1. FIG. 1 is a cross-sectional view of a modified magnetron-type plasma processing apparatus, being the substrate processing apparatus, according to this embodiment.

A modified magnetron type plasma processing apparatus 100 (described as MMT apparatus 100 hereafter), is formed as a substrate processing apparatus configured to plasma-process a wafer 200, being a substrate such as silicon (Si), using a modified magnetron type plasma source for generating high density plasma by an electric field and a magnetic field. Namely, the MMT apparatus is configured to load the wafer 200 into an air-tightly sealed processing chamber 201, so that magnetron discharge is caused by applying high frequency voltage to a processing gas supplied into the processing chamber 201 under a constant pressure. With such a mechanism, by exciting the processing gas, oxidizing and nitriding treatment can be applied to the wafer, or a thin film can be formed, or etching and each kind of plasma processing can be applied to the surface of the wafer 200.

(Processing Chamber)

The MMT apparatus 100 comprises a processing furnace 202 configured to apply plasma-processing to the wafer 200. A processing vessel 203 is provided so as to construct the processing chamber 201 in the processing furnace 202. The processing vessel 203 comprises a dome-shaped upper side vessel 210, being a first vessel, and a bowl-shaped lower side vessel 211, being a second vessel. The processing chamber 201 is formed by covering the lower side vessel 211 by the upper side vessel 210. The upper side vessel 210 is made of a non-metal material such as aluminum oxide ($Al_2O_3$) or quartz ($SiO_2$), and the lower side vessel 211 is made of aluminum (Al) for example.

Further, a gate valve 244 is provided on a lower side wall of the lower vessel 211. The gate valve 244 is configured be opened for loading the wafer 200 into the processing chamber 201 and unloading the wafer 200 to outside of the processing chamber 201 using a transport mechanism (not shown). The gate valve 244 is configured to be closed for air-tightly sealing the inside of the processing chamber 201, as a partition valve.

(Substrate Supporting Member)

A substrate supporting member 217 supporting the wafer 200 is provided in a bottom-side center of the processing chamber 201. The substrate supporting member 217 has a susceptor 219 and a susceptor cover 218 made of a non-metal material such as quartz (SiO2), etc., respectively (see FIG. 2), so that a metal contamination on a film, etc., formed on the wafer 200 can be reduced. The susceptor 219 and the susceptor cover 218 will be described later.

A heater 217b, being a heating section for heating the wafer 200, is integrally embedded in the substrate supporting member 217. The heater 217b is configured to heat the wafer 200 to about 25° C. to 700° C. when power is supplied thereto.

The substrate supporting member 217 is electrically insulated from the lower side vessel 211. An impedance adjusting electrode 217c is provided in the substrate supporting member 217. The impedance adjusting electrode 217c is earthed via an impedance variable mechanism 274, being an impedance adjustment section. The impedance adjusting electrode 217c functions as a second electrode with respect to a cylindrical electrode 215, being a first electrode as will be described later. The impedance variable mechanism 274 is composed of a coil and a variable capacitor, and by controlling inductance and resistance of the coil and a capacitance value of the variable capacitor, an electrical potential (bias voltage) of the wafer 200 can be controlled via the impedance adjusting electrode 217c and the substrate supporting member 217.

A substrate supporting member elevation/rotation mechanism 268 for elevating and rotating the substrate supporting member 217 is provided in the substrate supporting member 217. Further, through holes 217a are formed on the substrate supporting member 217, and meanwhile wafer upthrust pins 266 are formed on a bottom face of the lower side vessel 211. The through holes 217a and the wafer upthrust pins 266 are provided at mutually opposed positions in three places each. When the substrate supporting member 217 is lowered by the substrate supporting member elevation/rotation mechanism 268, the wafer 200 loaded into the processing chamber 201 is temporarily held by the wafer upthrust pins 266, in such a way that the wafer upthrust pins 266 are passed through the through holes 217a in non-contact state with the substrate supporting member 217. When the substrate supporting member 217 is elevated by the substrate supporting member elevation/rotation mechanism 268, the wafer 200 is placed on the substrate supporting member 217 from the wafer upthrust pins 266. Note that as will be described later, the through holes 217a are also configured as flow passages for escaping the gas between the wafer 200 and the substrate supporting member 217.

Further, the substrate supporting member elevation/rotation mechanism 268 is configured to rotate the wafer 200 during plasma-processing and improve uniformity of the plasma-processing in the surface of the wafer 200, by rotating the substrate supporting member 217 around a vertical axis that passes a center of an upper surface of the substrate supporting member 217.

(Lamp Heating Unit)

A light transmission window 278 is provided in an upper part of the processing chamber 201, namely on an upper surface of the upper side vessel 210, and a lamp heating unit 280, being a lamp heating device, is installed outside of the processing vessel 203 on the light transmission window 278. The lamp heating unit 280 is provided at a position opposed to the substrate supporting member 217, so as to heat the wafer 200 from above the wafer 200. By lighting the lamp heating unit 280, the wafer 200 can be heated in a shorter time than a case of using the heater 217b. Further, by using the heater 217b together, the temperature of the surface of the substrate can be set to 900° C. for example.

(Gas Supply Section)

A shower head 236 is provided in an upper part of the processing chamber 201, namely in an upper part of the upper side vessel 210. The shower head 236 comprises: cap-shaped lid member 233; a gas introduction port 234; a buffer chamber 237, an opening 238; a shielding plate 240; and a gas blowing port 239, so that each kind of gas such as processing gas can be supplied into the processing chamber 201. The buffer chamber 237 is formed as a distribution space for distributing each kind of gas introduced from the gas blowing port 234.

A downstream end of an oxygen-containing gas supply pipe 232a for supplying oxygen ($O_2$) gas, being oxygen-containing gas, and a downstream end of a nitrogen-containing gas supply pipe 232b for supplying nitrogen ($N_2$) gas, being nitrogen-containing gas, are connected to the gas blowing port 234 so as to merge with each other. An $O_2$ gas supply source 250a, a mass flow controller 252a, being a flow control device, and a valve 253a, being an open/close valve, are provided on the oxygen-containing gas supply pipe 232a sequentially from the upstream side. An $N_2$ gas supply source 250b, a mass flow controller 252b, being the flow control device, and a valve 253b, being the open/close valve, are provided on the nitrogen-containing gas supply pipe 232b sequentially from the upstream side. A valve 254 is provided on the downstream side where the oxygen-containing gas supply pipe 232a and the nitrogen-containing gas supply pipe 232b are merged, which is then connected to the upstream end of the gas introduction port 234 via a gasket 203b. The oxygen-containing gas and the nitrogen-containing gas can be supplied into the processing chamber 201 via the gas supply pipes 232a and 232b, while adjusting the flow rate of each gas by the mass flow controllers 252a, 252b, by opening the valves 253a, 253b, and 254.

A gas supply section of this embodiment is mainly constituted of the shower head 236 (lid member 233, gas introduction port 234, buffer chamber 237, opening 238, shielding plate 240, and gas blowing port 239), the oxygen-containing gas supply pipe 232a, the nitrogen-containing gas supply pipe 232b, the $O_2$ gas supply source 250a, the $N_2$ gas supply source 250b, the mass flow controllers 252a, 252b, and the valves 253a, 253b, 254.

(Gas Exhaust Section)

A gas exhaust port 235 configured to exhaust gas from the inside of the processing chamber 201 is provided on the side wall of the lower side vessel 211. The upstream end of the gas exhaust pipe 231 is connected to the gas exhaust port 235. APC (Auto Pressure Controller) 242, being a pressure adjuster (pressure adjustment section), and a valve 243b, being an open/close valve, and a vacuum pump 246, being a vacuum exhaust device, are provided on the gas exhaust pipe 231 sequentially from the upstream side.

A gas exhaust section of this embodiment is mainly constituted of the gas exhaust port 235, the gas exhaust pipe 231, the APC 242, the valve 243b, and the vacuum pump 246.

(Plasma Generating Section)

The cylindrical electrode 215, being the first electrode, is provided on an outer peripheral part of the processing chamber 201, namely outside of the side wall of the upper side vessel 210, so as to surround the processing chamber 201. The cylindrical electrode 215 is formed into a cylindrical shape for example. The cylindrical electrode 215 is connected to a high frequency power source 273 for applying high frequency power via a matcher 272 that performs matching of impedance.

An upper side magnet 216a and a lower side magnet 216b are respectively attached to upper/lower ends on an outside surface of the cylindrical electrode 215. Both the upper side magnet 216a and the lower side magnet 216b are formed by a permanent magnet which is formed into a cylindrical shape for example. The upper side magnet 216a and the lower side magnet 216b have magnetic poles at the side facing the processing chamber 201 and at the side opposite thereto. The magnetic poles of the upper side magnet 216a and the lower side magnet 216b are disposed in an opposite direction. Namely, magnetic poles of the upper side magnet 216a and the lower side magnet 216b at the side facing the processing chamber 201 are mutually different poles. Thus, lines of magnetic force in a cylindrical axis direction are formed along an inner side surface of the cylindrical electrode 215.

A magnetic field is generated by the upper side magnet 216a and the lower side magnet 216b, then the processing gas is introduced into the processing chamber 201, and thereafter high frequency power is supplied to the cylindrical electrode 215, and the electrical field is formed, to thereby generate magnetron discharge plasma in a plasma generation region 224. Discharged electrons are moved to circulate by the aforementioned electromagnetic field, to thereby increase an ionization generation ratio of plasma, and high density plasma with long lifetime can be generated.

Note that a metal shielding plate 223 for effectively shielding the electromagnetic field is provided around the cylindrical electrode 215, the upper side magnet 216a, and the lower side magnet 216b, so that the electromagnetic field formed by them has no adverse influence on other device or an outer environment.

A plasma generating section of this embodiment is mainly constituted of the cylindrical electrode 215, the matcher 272, the high frequency power source 273, the upper side magnet 216a, and the lower side magnet 216b.

(Controller)

A controller 221, being a control section, controls APC 242, valve 243, and vacuum pump 246b through a signal line A; controls a substrate supporting member elevation/rotation mechanism 268 through a signal line B; controls the heater 217b and the impedance variable mechanism 274 through a signal line C; controls the gate valve 244 through a signal line D; controls the matcher 272 and the high frequency power source 273 through a signal line E; controls the mass flow controllers 252a, 252b and valves 253a, 253b, 254 through a signal line F; and controls the lamp heating unit 280 through a signal line G, respectively.

(2) Structure of the Substrate Supporting Member

Figure 2:
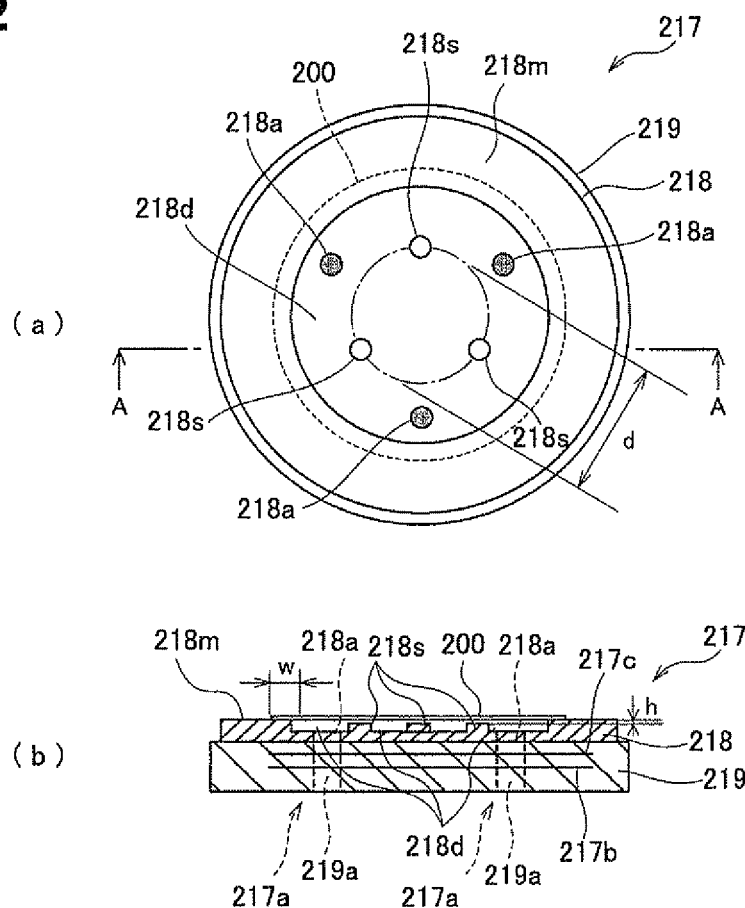

The susceptor 219 and the susceptor cover 218 provided in the substrate supporting member 217 of this embodiment will be described next, using FIG. 2 mainly. FIG. 2 is a schematic view showing the substrate supporting member 217 provided in the substrate processing apparatus according to this embodiment, wherein FIG. 2A is a plane view of the substrate processing section 217, and FIG. 2B is a cross-sectional view taken along the line A-A of the substrate supporting member 217.

As shown in FIG. 2B, the substrate supporting member 217 has the susceptor 219 in which the heater 217b and the impedance adjusting electrode 217c are embedded, and a disc-shaped susceptor cover 218 with a thickness of 0.7 mm or more and 1.5 mm or less. The susceptor cover 218 is attachably and detachably provided to/from the susceptor 219. A diameter and a size of each portion of the susceptor 219 and the susceptor cover 218, are defined according to a diameter of the supported wafer 200. The susceptor 219 and the susceptor cover 218 corresponding to the wafer 200 with a diameter in a range of 200 mm to 450 mm, for example, 300 mm, will be described hereafter.

(Protruding Area and Recessed Area)

The susceptor cover 218 has an outer peripheral supporting member 218m, being the protruding area for supporting a part of the wafer 200 from below. For example, the outer peripheral supporting member 218m is configured to support an area from an edge of the wafer 200 to less than 3 mm toward the inside in a radial direction. At this time, the outer peripheral supporting member 218m continuously supports the edge side so as to surround the wafer 200 for example. Further, width w formed by the contact between the outer peripheral supporting member 218m and the rear surface of the wafer 200, is less than 3 mm and for example 1.5 mm or less.

Further, the susceptor cover 218 has a central depressed portion 218d, being the recessed area, inside of the outer peripheral supporting member 218m. For example, the central depressed portion 218d is formed on the surface of the susceptor cover 218 by counter boring, so as not to be brought into contact with the wafer 200 supported by the outer peripheral supporting member 218m.

Thus, the outer peripheral supporting member 218m and the central depressed portion 218d are provided on the susceptor cover 218, and therefore the contact area between the upper surface of the substrate supporting member 217 and the rear surface of the wafer 200 is reduced, and particles and a scratch on the rear surface of the wafer 200 can be reduced.

Further, by providing a space on the rear surface of the wafer 200 using the central depressed portion 218d, electrostatic adsorption of the wafer 200 on the substrate supporting member 217 can be suppressed. Namely, the space with lower dielectric constant than that of a material constituting the susceptor cover 218 is interposed between the wafer 200 and the impedance adjusting electrode 217c, and therefore an electrostatic force generated between the susceptor cover 218 and the wafer 200 can be reduced. Note that the electrostatic adsorption occurs when electrically charged wafer 200 by plasma is drawn by the impedance adjusting electrode 217c inside of the susceptor 219. According to this embodiment, the wafer 200 can be easily separated from the substrate supporting member 217 during unloading of the wafer 200. Further, by suppressing the electrostatic adsorption, a contact pressure between the wafer 200 and the substrate supporting member 217 is reduced, thus reducing a friction force between the rear surface of the wafer 200 and the substrate supporting member 217. Thus, the scratch formed on the rear surface of the wafer 200 and particles adhered to the rear surface of the wafer 200 can be reduced.

Further, the edge side of the wafer 200 which is less affected by the particles, is supported by the outer peripheral supporting member 218m, and therefore even if the particles are adhered to the rear surface of the wafer 200, the semiconductor device is less affected by such particles. Further, there is no gap formed between the edge portion of the wafer 200 and the susceptor cover 218, owing to the outer peripheral supporting member 218m for supporting the wafer 200 so as to surround the wafer 200. Accordingly, spread of plasma extending to the rear surface of the wafer 200 can be suppressed.

Note that the outer peripheral supporting member 218m of the susceptor cover 218 supports a bottom edge portion of the wafer 200 from below, so as not to be brought into contact with the side portion of the wafer 200 (side face of the wafer 200). Namely, the upper surface of the outer peripheral supporting member 218m is not formed in a shape having a step to engage with the side portion of the wafer 200, but is formed in a flat shape. Thus, the generation of particles due to contact between the side portion of the wafer 200 and the susceptor cover 218 can be suppressed, thus making it possible to improve the quality of the substrate processing.

(Flow Passage)

Further, the susceptor cover 218 has through holes 218a communicating with inside of the central depressed portion 218d. A part of the flow passages is formed by the through holes 218a for escaping the gas between the wafer 200 and the substrate supporting member 217 from the central depressed portion 218d side. The through holes 218a are opened in at least three places of the central depressed portion 218d for example. The through holes 218a at three places are disposed on a circle concentric with the outer peripheral edge of the susceptor cover 218 for example, in such a manner as being away from each other by approximately the same distance. The susceptor 219 has through holes 219a at positions overlapped on the through holes 218a formed on the susceptor cover 218. The through holes 217a, being the flow passages provided in the substrate supporting member 217, are constituted of the through holes 218a and the through holes 219a.

Thus, by further providing the through holes 217a that communicates with inside of the central depressed portion 218d, the gas sandwiched between the wafer 200 and the substrate supporting member 217 can be escaped, when the wafer 200 is placed on the substrate supporting member 217, thus making it difficult to slide the wafer 200 sideways.

(Auxiliary Protruding Area)

The central depressed portion 218d has a central supporting member 218s as the auxiliary protruding area for auxiliarily supporting a part of the wafer 200 from below. For example, one central supporting member 218s, or preferably a plurality of central supporting members 218s, and further preferably the or more central supporting members 218s are provided in the shape of protrusions. In an example shown in FIG. 2A, three central supporting members 218s are disposed on the circle concentric with the outer peripheral edge of the susceptor cover 218 in such a manner as being away from each other by approximately the same distance, for example at a position deviated from an opening position of the through holes 218a by about 60°. Three central supporting members 218s are disposed with a diameter of a prescribed pitch circle diameter (POD) d, wherein the pitch circle diameter d can be set to 145 mm or more and 155 mm or less for example.

Further, each central supporting member 218s is formed lower than the outer peripheral supporting member 218m, and an elevation difference h from the outer peripheral supporting member 218m is 0.1 mm or more and 0.2 mm or less for example. Note that when the central supporting member 218s is formed by applying counterbore processing to the surface (the surface of the central depressed portion 218d) of the susceptor cover 218, the height of the central supporting member 218s can be set to about 0.04 mm to 0.1 mm for example. Further, when the central supporting member 218s is formed by installing a disc-shaped quartz member, etc., for example on the surface of the susceptor cover 218 (the surface of the central depressed portion 218d), the height of the central supporting member 218s can be set to about 0.5 mm for example. Note that the height of the outer peripheral supporting member 218m (depth of the central depressed portion 218d) is obtained by adding 0.1 mm to 0.2 mm to the height of the central supporting member 218s.

Thus, the central supporting member 218s is provided inside of the outer peripheral supporting member 218m supporting the wafer 200 by the edge side, so as to be lower than the outer peripheral supporting member 218m. With this structure, the particles on the rear surface can be reduced by further lowering the contact pressure between the central supporting member 218s and the wafer 200. Further, capacitance that exists between the wafer 200 and the impedance adjusting electrode 217c can be reduced, and the electrostatic force can be reduced.

Note that in a case of forming the central supporting member 218s in a cylindrical shape, the diameter of its upper end surface (supporting surface) is preferably set to be smaller than 2.8 mm. With this structure, the wafer 200 can be supported by a so-called point, namely, the contact area between the wafer 200 and the central supporting member 218s can be made small. As a result, the generation of particles caused by the contact between the wafer 200 and the central supporting member 218s can be effectively suppressed.

Further, in a case of providing a plurality of central supporting members 218s, the central supporting members 218s are preferably provided so as to surround an area excluding the center of the wafer 200. Namely, preferably the central supporting members 218s are not provided near the center of the wafer 200 (near the center of the central depressed portion 218d). The center of the wafer 200 is bent most, when its outer peripheral edge is supported by the outer peripheral supporting member 218m. However, if the central supporting member 218s is provided in the center of the wafer 200, the contact pressure between the wafer 200 and the central supporting member 218s becomes excessively large, thus posing a problem that the generation of particles is increased. Meanwhile, as shown in FIG. 2, by providing the central supporting member 218s so as to surround the area excluding the center of the wafer 200, increase of the contact pressure between the wafer 200 and the central supporting member 218s can be prevented, and the generation of particles can be suppressed.

(The Other Structure)

Further, in this embodiment, for example the susceptor cover 218 is formed separately from the susceptor 219. Thus, the susceptor cover 218 only can be exchanged according to a wasting condition of the upper surface of the substrate supporting member 217, and the thickness and the shape of the susceptor cover 218 can be easily changed according to a desired substrate processing characteristic, etc. For example, by forming the susceptor cover 218 thick and increasing the distance between the impedance adjusting electrode 217c and the wafer 200, the capacitance between the impedance adjusting electrode 217c and the wafer 200 can be made small, and adsorption of the wafer 200 can be further suppressed.

Figure 3:
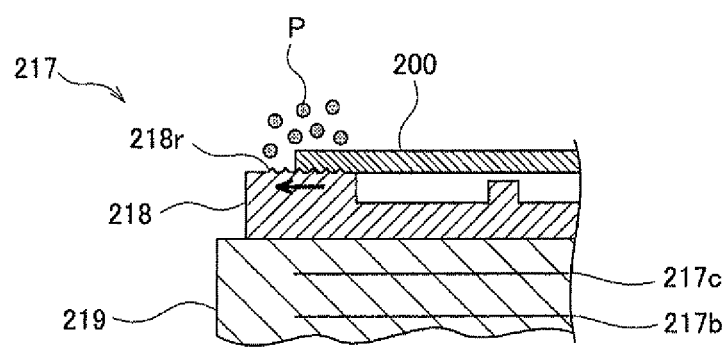
FIG. 3 is a schematic view showing a model of generating particles from the substrate supporting member.

Note that preferably polishing, etc., is applied to the surface of the susceptor cover 218, to thereby obtain a small surface roughness Ra. For example, the susceptor cover 218 made of quartz, etc., has the surface roughness Ra of about 2.5 µm for example if it is subjected to cutting treatment only, thus sometimes increasing the particles on the surface of the wafer 200. The particles are probably generated by the model shown in FIG. 3. Namely, as shown in FIG. 3, the wafer 200 placed on the substrate supporting member 217 is expanded by heating by the heater 217b provided in the substrate supporting member 217. At this time, if the surface of the susceptor cover is rough, the wafer 200 and the outer peripheral supporting member 218m of the susceptor cover 218 are rubbed with each other, to thereby generate particles P, and flying particles P are adhered to the surface of the wafer 200 for example.

Therefore, by making the surface roughness Ra of the susceptor cover 218 small, the generation of such particles P can be suppressed, thus reducing the adhesion of the particles P to the surface of the wafer 200. The surface roughness Ra of the susceptor cover 218 can be reduced by burning finish for example. If a deformation is generated by burning because the susceptor cover 218 is thin, polishing finish is also acceptable. In this case as well, polishing is preferably applied to the susceptor cover 218 so as to obtain the surface roughness Ra equivalent to the surface roughness Ra in a case of a burning finish.

Further, chamfering of corners of the outer peripheral supporting member 218m and the central supporting member 218s may be performed simultaneously, during the aforementioned burning finish or polishing finish. Thus, a local contact pressure with the wafer 200 is relaxed, with a supporting surface of the wafer 200 of each supporting member 218m, 218s as a mirror surface, to thereby further reduce the generation and adhesion of the particles. Further, a minute gap between the edge portion of the wafer 200 and the susceptor cover 218 can be reduced, to thereby further suppress the spread of plasma to the rear surface of the wafer 200.

(3) Substrate Processing Step

Figure 4:
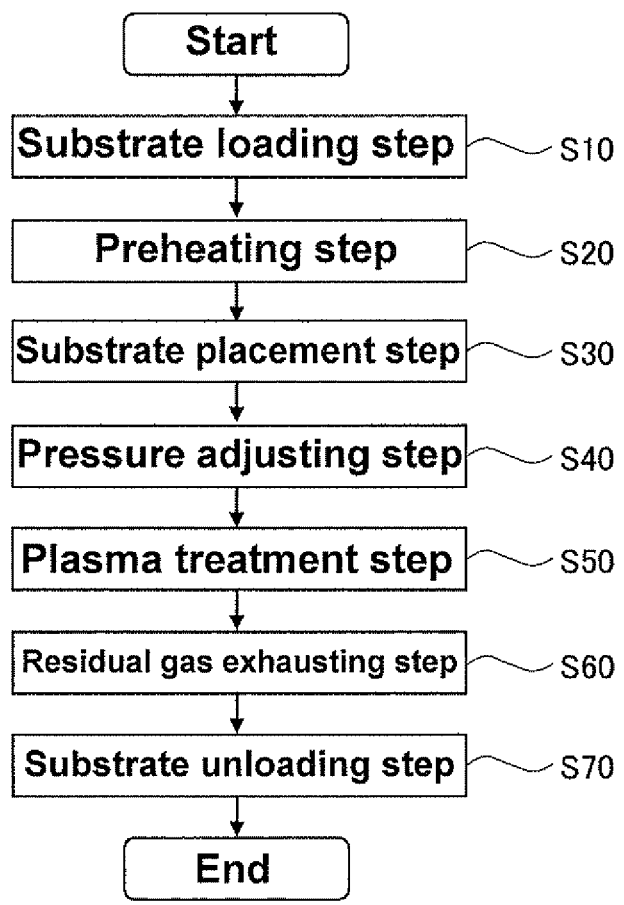
FIG. 4 is a flowchart showing a substrate processing step according to the first embodiment of the present invention.

The substrate processing step according to this embodiment will be described next, using FIG. 4 mainly. FIG. 4 is a flowchart showing the substrate processing step according to this embodiment. The substrate processing step according to this embodiment is executed by the aforementioned MMT apparatus 100, as a part of the manufacturing steps of a semiconductor device for example. In the substrate processing step according to this embodiment, nitriding treatment is applied to the surface of the wafer 200 made of silicon (Si) for example. In the explanation given hereafter, an operation of each section constituting the MMT apparatus 100 is controlled by the controller 221.

(Substrate Loading Step)

First, the wafer 200 is loaded into the processing chamber 201. Specifically, the substrate supporting member 217 is lowered to a transport position of the wafer 200, and the wafer upthrust pins 266 are set to penetrate the through holes 217a of the substrate supporting member 217. As a result, the wafer upthrust pins 266 are set in a state of protruding from the upper surface of the substrate supporting member 217 by a prescribed height portion. Subsequently, the gate valve 244 is opened, and the wafer 200 is loaded into the processing chamber 201 from a vacuum transport chamber (not shown) adjacent to the processing chamber 201, using a transport mechanism not shown. As a result, the wafer 200 is supported in a horizontal posture by the wafer upthrust pins 266 protruded from the upper surface of the substrate supporting member 217. After the wafer 200 is loaded into the processing chamber 201, the transport mechanism is retreated to outside of the processing chamber 201, and the inside of the processing chamber 201 is air-tightly closed by closing the gate valve 244.

(Preheating Step)

Figure 5:
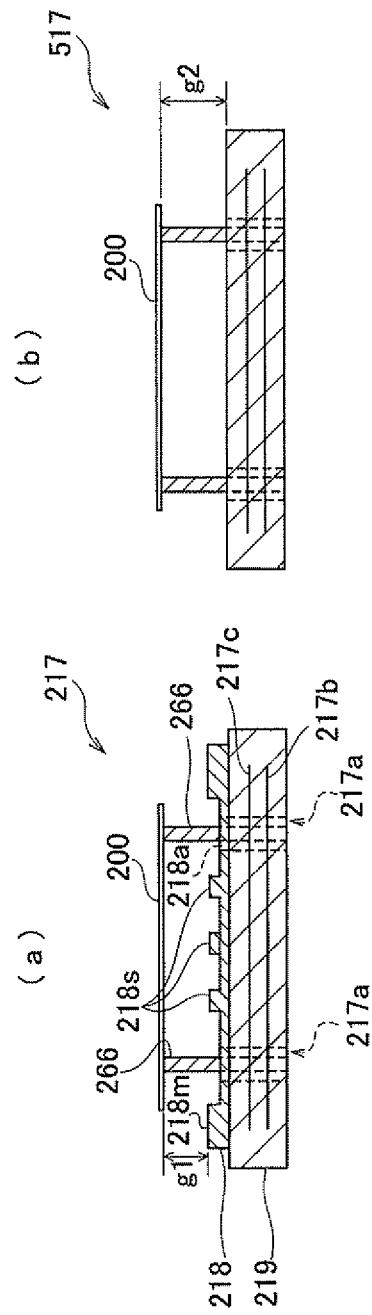
FIG. 5A is a schematic view showing a state of holding a substrate in a preheating step according to the first embodiment of the present invention.
FIG. 5B is a schematic view showing a state of holding the substrate in a preheating step according to a conventional technique.

Power is previously supplied to the heater 217b, so that the heater 217b and the substrate supporting member 217 are heated to a prescribed temperature within a range of 25° C. to 900° C. for example. In the preheating step, the loaded wafer 200 is not immediately placed on the substrate supporting member 217, and as shown in FIG. 5A, the wafer 200 is preheated by heat radiation from the heater 217b in a state of holding the wafer 200 on the wafer upthrust pins 266 in such a manner as being away from the outer peripheral supporting member 218m on the upper surface of the substrate supporting member 217 by a prescribed distance g1. At this time, when a boosting gas is supplied into the processing chamber 201 in a state of increasing the pressure in the processing chamber 201, heat is transferred to the wafer 200 from the substrate supporting member 217 by the boosting gas, thus improving a temperature rising speed of the wafer 200.

However, as shown in a conventional example of FIG. 5B, in a case that the wafer 200 held on the wafer upthrust pins 266 in such a manner as being away from the upper surface of a conventional substrate supporting member 517 by a prescribed distance g2, is placed on approximately a flat upper surface of a substrate supporting member 517 after end of preheating, the wafer 200 slides sideways in some cases, due to the gas (boosting gas, etc.,) between the wafer 200 and the substrate supporting member 517 if the pressure inside of the processing chamber 201 is high. Particularly, if the pressure inside of the processing chamber 201 exceeds 100 Pa, the wafer 200 is easily slide sideways. Further, if preheating is carried out under a low pressure to suppress the sliding sideways, time is required for raising the temperature of the wafer 200. Alternately, if the pressure is set to be low only when the wafer is placed on the substrate supporting member 217, the time is required because the number of the number of steps is increased for reducing the pressure. Therefore, in any case, throughput is lowered, thus reducing the productivity.

In this embodiment, the substrate supporting member 217 is formed so that the contact area with the wafer 200 is reduced by the outer peripheral supporting member 218m and the central depressed portion 218d, with the through holes 217a formed thereon, to communicate with inside of the central depressed portion 218d. Therefore, preheating can be carried out under a high pressure by a procedure described below, while suppressing the sliding of the wafer 200 sideways, and the temperature rising speed of the wafer 200 can be increased.

In this embodiment, first, the valves 253b, 254 are opened in a state that the wafer 200 is held on the wafer upthrust pins 266, to thereby supply $N_2$ gas, being the boosting gas, into the processing chamber 201 via the buffer chamber 237, while controlling the flow rate by the mass flow controller 252b. At this time, the flow rate of the $N_2$ gas is set to a prescribed value within a range of 500 sccm to 3000 sccm for example. Further, an opening angle of the APC 242 is adjusted while exhausting the inside of the processing chamber 201 by the vacuum pump 246, to thereby set the pressure inside of the processing chamber 201 to a prescribed pressure which is higher than 100 Pa for example. The vacuum pump 246 is continued to be operated until at least the substrate unloading step as will be described later is ended.

The temperature of the wafer 200 can be raised to a prescribed temperature by heat radiation and heat transmission of the $N_2$ gas from the substrate supporting member 217, by maintaining the aforementioned state for a prescribed time, for example for 10 seconds to 60 seconds.

(Substrate Placing Step)

After elapse of a prescribed time, the wafer 200 with its temperature raised to a prescribed temperature, is placed on the substrate supporting member 217 from the wafer upthrust pins 266. Namely, the substrate supporting member 217 is elevated using the substrate supporting member elevation/rotation mechanism 268, to thereby support the wafer 200 on the substrate supporting member 217. At this time, the inside of the processing chamber 201 is set in a higher pressure than 100 Pa for example, similarly to the previous preheating step. According to the substrate supporting member 217 of this embodiment, the wafer 200 can be placed on the substrate supporting member 217 while suppressing the sliding of the wafer 200 sideways even under such a high pressure.

When the wafer 200 is placed on the substrate supporting member 217, the wafer 200 is elevated to a prescribed processing position. Further, rotation of the wafer 200 is started using a rotating function of the substrate supporting member elevation/rotation mechanism 268. Uniformity of substrate processing in the surface of the wafer 200 can be improved by continuing the rotation until the end of the exhausting step as will be described later.

(Pressure Adjusting Step)

Next, supply of the $N_2$ gas, being the processing gas, is performed, and the pressure inside of the processing chamber 201 which is kept in a high pressure, is adjusted to a pressure in the plasma treatment step as will be described later. In this embodiment, both the boosting gas and processing gas are $N_2$ gas, and therefore the flow rate of the $N_2$ gas is set to a prescribed value within a range of 10 sccm to 500 sccm for example, by readjusting the flow rate of the $N_2$ gas by the mass flow controller 252b while continuing the supply of the $N_2$ gas, which is started by the preheating step. Further, the pressure inside of the processing chamber 201 is readjusted by the APC 242, to thereby set the pressure inside of the processing chamber 201 to a prescribed value within a range of 1 Pa to 200 Pa for example.

(Plasma Treatment Step)

when the pressure inside of the processing chamber 201 is stabilized, high frequency power of a prescribed output value within a range of 150 W to 200 W for example is started to be applied to the cylindrical electrode 215 from the high frequency power source 273 via the matcher 272. At this time, the impedance variable mechanism 274 is previously controlled to a prescribed impedance value. Thus, plasma discharge is caused in the processing chamber 201, more specifically in the plasma generation region 224 in the upper part of the wafer 200, to thereby excite the $N_2$ gas. The $N_2$ gas is turned into a plasma state and is dissociated for example, and reactive species such as nitrogen active species containing nitrogen (N) is generated. By this $N_2$ gas turned into the plasma state, nitriding treatment is applied to the surface of the wafer 200.

Thereafter, after elapse of a prescribed processing time within a range of 2 minutes to 5 minutes for example, application of the power from the high frequency power source 273 is stopped, to thereby stop the plasma discharge in the processing chamber 201. Further, the valves 253b, 254 are closed, to thereby stop the supply of the $N_2$ gas into the processing chamber 201. As described above, the plasma treatment step is ended.

Note that in the aforementioned plasma treatment step, the wafer 200 is electrically charged in plasma, and is drawn to the impedance adjusting electrode 217c in the susceptor 219. Thus, the wafer 200 is in a state of being adsorbed on the upper surface of the substrate supporting member 217. In this embodiment, the central supporting member 218s is formed lower than the outer peripheral supporting member 218m, and therefore even in such a state, the increase of the contact pressure between the central supporting member 218s and the wafer 200 is relaxed, and the increase of the particles can be suppressed. An adsorption state of the wafer 200 is maintained until the wafer 200 is unloaded as will be descried later.

(Residual Gas Exhausting Step)

When the supply of the $N_2$ gas is stopped, the inside of the processing chamber 201 is exhausted using the gas exhaust pipe 231. Thus, the $N_2$ gas remained in the processing chamber 201 and self-decomposed $N_2$ gas resulting in exhaust gas, are exhausted to outside of the processing chamber 201. Thereafter, the opening angle of the APC 242 is adjusted, to thereby adjust the pressure inside of the processing chamber 201 to the same pressure as the pressure inside of a vacuum transport chamber (loading destination of the wafer 200, not shown) adjacent to the processing chamber 201.

(Substrate Unloading Step)

When the inside of the processing chamber 201 is set in a prescribed pressure, the substrate supporting member 217 is lowered to the transport position of the wafer 200, to thereby support the wafer 200 on the wafer upthrust pins 266. Then, by opening the gate valve 244, the wafer 200 is unloaded to the outside of the processing chamber 201 using the transport mechanism not shown. As described above, the substrate processing step according to this embodiment is ended.

Note that as described above, the wafer 200 is still in a state of being adsorbed on the upper surface of the substrate supporting member 217 during unloading. In a case of a conventional substrate supporting member that supports the wafer 200 by approximately the whole surface, the wafer 200 stuck to the surface of the substrate supporting member, is pushed-up by the wafer upthrust pins 266 and is forcibly separated and sprung-out, to thereby cause the positional deviation, thus posing a problem that the wafer 200 is broken.

However, in this embodiment, the wafer 200 is supported by a small contact area, and therefore is easily separated from the substrate supporting member 217. Accordingly, the risk of the spring-out of the wafer 200 resulting in breakage can be reduced.

(4) Effect of this Embodiment

According to this embodiment, one or a plurality of effects as described below can be exhibited.
(a) According to this embodiment, the substrate supporting member 217 has on its upper surface, the outer peripheral supporting member 218m supporting a part of the wafer 200 from below, and the central depressed portion 218d disposed so as not to be brought into contact with the wafer 200 supported by the outer peripheral supporting member 218m. Thus, the contact area is reduced, which is formed by the substrate supporting member 217 and the wafer 200 placed on the substrate supporting member 217, thus suppressing the adhesion of the particles to the rear surface of the wafer 200, and reducing the scratch on the rear surface of the wafer 200.

In a case of the conventional substrate supporting member having approximately, a flat upper surface, the whole surface of the rear surface of the wafer 200 is supported by the upper surface of the substrate supporting member, and therefore particles are adhered to the rear surface of the wafer 200, resulting in scratching the rear surface of the wafer 200 in some cases. Such particles are generated by friction between the wafer 200 and the substrate supporting member, or are generated by sputtering the substrate supporting member and other inner members in the processing chamber by plasma. The wafer 200 having the particles or scratch on the rear surface, is locally distorted around the particles and the scratch when being placed on a wafer stage, etc., of an exposure machine in an exposure process performed later for example, thus causing a defocusing of the exposure machine in some cases.

In this embodiment, the particles and the scratch on the rear surface of the wafer 200 is reduced, and such a defocusing is hardly occur. Therefore, the yield rate of the semiconductor device formed on the wafer 200 can be improved.

(b) Further, according to this embodiment, the substrate supporting member 217 further has the through holes 217a that communicate with inside of the central depressed portion 218d, for escaping the gas between the wafer 200 and the substrate supporting member 217 from the central depressed portion 218d side. Thus, when the wafer 200 is placed on the substrate supporting member 217, the gas between the wafer 200 and the substrate supporting member 217 is escaped to a lower structure of the substrate supporting member 217 from the through holes 217a. Therefore the sliding of the wafer 200 sideways can be suppressed.

In the conventional substrate supporting member having approximately a flat upper surface, in a case that the gas such as processing gas and inert gas exists in the processing chamber 201 when the wafer 200 is placed on the substrate supporting member, the gas is sandwiched between the wafer 200 and the substrate supporting member, thus sliding the wafer 200 sideways in some cases. When the sliding occurs, there is a risk of generating transport error of the wafer 200 and breaking the wafer 200 for example.

In this embodiment, the sliding of the wafer 200 can be suppressed, thus not allowing the transport error or breakage of the wafer 200 to occur.

(c) Further according to this embodiment, the outer peripheral supporting member 218m supports the edge side of the wafer 200, and the central depressed portion 218d is provided inside of the outer peripheral supporting member 218m. Further, the outer peripheral supporting member 218m supports an area of less than 3 mm inside from the edge of the wafer 200. Thus, even if the particles are adhered to the rear surface of the wafer 200, an influence on the semiconductor device can be reduced.

For example, an area of several mm inside from the edge of the wafer 200 is usually outside a formation area of the semiconductor device. Therefore, the particles or scratch on the rear surface of the wafer 200 can be allowed to a certain degree. For example, in a case of an exposure device, even if the defocusing is generated due to local distortion outside of the formation area of the semiconductor device, there is almost no influence on the formation area of the semiconductor device. Further, in a case that the whole body of the wafer 200 is tilted, tilt can be corrected by a tilt correction mechanism, etc., provided in the exposure device.

According to this embodiment, the outer supporting member 218m is brought into contact with the wafer 200 mainly outside of the formation area of the semiconductor device. Therefore, the influence on the semiconductor device by the adhesion of the particles can be reduced.

(d) Further, according to this embodiment, the outer peripheral supporting member 218m supports the edge side of the wafer 200 continuously. Thus, spread of the plasma to the rear surface of the wafer 200 is inhibited, thus suppressing etching applied to the rear surface of the wafer 200 or adhesion of deposition, etc., on the rear surface of the wafer 200. Therefore, the particles and scratches on the rear surface of the wafer 200 can be further reduced.

(e) Further, according to this embodiment, by forming a space on the rear surface of the wafer 200 using the central depressed portion 218d, the electrostatic adsorption of the wafer 200 on the substrate supporting member 217 can be suppressed. Namely, the space with lower dielectric constant than that of the material constituting the susceptor cover 218, is interposed between the wafer 200 and the impedance adjusting electrode 217c. Therefore, the electrostatic force generated between the susceptor cover 218 and the wafer 200 can be reduced.

(f) Further, according to this embodiment, the outer peripheral supporting member 218m of the susceptor cover 218 is configured to be not brought into contact with the side portion of the wafer 200 (side face of the wafer 200). Namely, the upper surface of the outer peripheral supporting member 218m is not formed in a shape having a step to engage with the side portion of the wafer 200, but is formed in a flat shape. Thus, the generation of particles due to contact between the side portion of the wafer 200 and the susceptor cover 218 can be suppressed, thus making it possible to improve the quality of the substrate processing.

(g) Further, according to this embodiment, the central depressed portion 218d has a central supporting member 218s which auxiliarily supports a part of the wafer 200 from below. Thus, bending of the wafer 200 can be corrected, which is supported by the outer peripheral supporting member 218m mainly on the edge side, and the uniformity of the substrate processing can be maintained in the surface of the wafer 200.

(h) Further, according to this embodiment, the central supporting member 218s is formed lower than the outer peripheral supporting member 218m by 0.1 mm to 0.2 mm for example. Thus, the contact pressure between the wafer 200 and the outer peripheral supporting member 218m can be lowered while correcting the bending of the wafer 200, and increase of the particles on the rear surface of the wafer 200 can be suppressed.

(i) Further, according to this embodiment, the diameter of the central supporting member 218s supporting the wafer 200 is smaller than 2.8 mm. Thus, the contact area between the wafer 200 and the central supporting member 218s can be set to be small, thus effectively suppressing the generation of particles due to the contact between the wafer 200 and the central supporting member 218s.

Note that if the area supporting the wafer 200 of the central supporting member 218s is increased, the contact pressure with the wafer 200 can be further lowered to thereby achieve a further stable support. However, the particles on the rear surface of the wafer 200 is increased by increasing a supporting area. As described above, the increase of the particles can be suppressed by providing an upper limit in the diameter of a supporting surface of the central supporting member 218s.

(j) Further, according to this embodiment, the central supporting member 218s is provided so as to surround the area excluding the center of the wafer 200. Namely, the central supporting member 218s is not provided near the center of the wafer 200 (near the center of the central depressed portion 218d). Thus, increase of the contact pressure between the wafer 200 and the central supporting member 218s can be prevented, and the generation of particles can be suppressed.

(k) Further, according to this embodiment, the surface roughness Ra of the substrate supporting member 217 is smaller than 2.5 μm. Thus, even if the wafer 200 is placed on the substrate supporting member 217 and is expanded, the generation of foreign matter P can be suppressed, which is caused by rubbing of the wafer 200 and the outer peripheral supporting member 218m with each other, and the particles on the surface of the wafer 200 can be reduced.

(l) Further, according to this embodiment, the substrate supporting member 217 has the susceptor 219 and the susceptor cover 218 attachable and detachable to/from the susceptor 219, and the outer peripheral supporting member 218m and the central depressed portion 218d are provided on the susceptor cover 218. Thus, only the susceptor cover 218 on the upper surface of the substrate supporting member 217, which is severely worn because it is exposed to plasma, can be suitably exchanged according to a wearing state. Thus, the cost and the number of the number of steps can be reduced.

(m) Further, according to this embodiment, there are provided the preheating step in which the pressure inside of the processing chamber 201 is increased, and the wafer 200 is preheated in a state of being away from the substrate supporting member 217; and the substrate placement step in which the wafer 200 is placed on the outer peripheral supporting member 218m of the substrate supporting member 217, with the pressure inside of the processing chamber 201 set to be higher than 100 Pa. Thus, even if the substrate placement step is performed in a high pressure state inside of the processing chamber 201, the wafer 200 hardly slides sideways, and therefore the pressure inside of the processing chamber 201 can be increased, and the temperature rising speed of the wafer 200 can be improved, thus also improving the throughput.

(n) Further, according to this embodiment, the space can be provided on the rear surface of the wafer 200, because the wafer 200 is placed on the susceptor cover 218. With this structure, a vacuum capacitance is formed between the wafer 200 and the impedance adjusting electrode 217c, and the bias of the wafer 200 can be reduced. By reducing the bias, a drawing force is weakened, which draws active gas that exists in plasma into the wafer 200, and isotropic processing can be applied to the bottom face and the side face of the recessed portion of the wafer 200 with minute unevenness formed on the surface, and a film with superior step coverage can be formed by applying nitriding treatment thereto for example.

(5) Modified Example of this Embodiment

Modified Example 1

Figure 6:
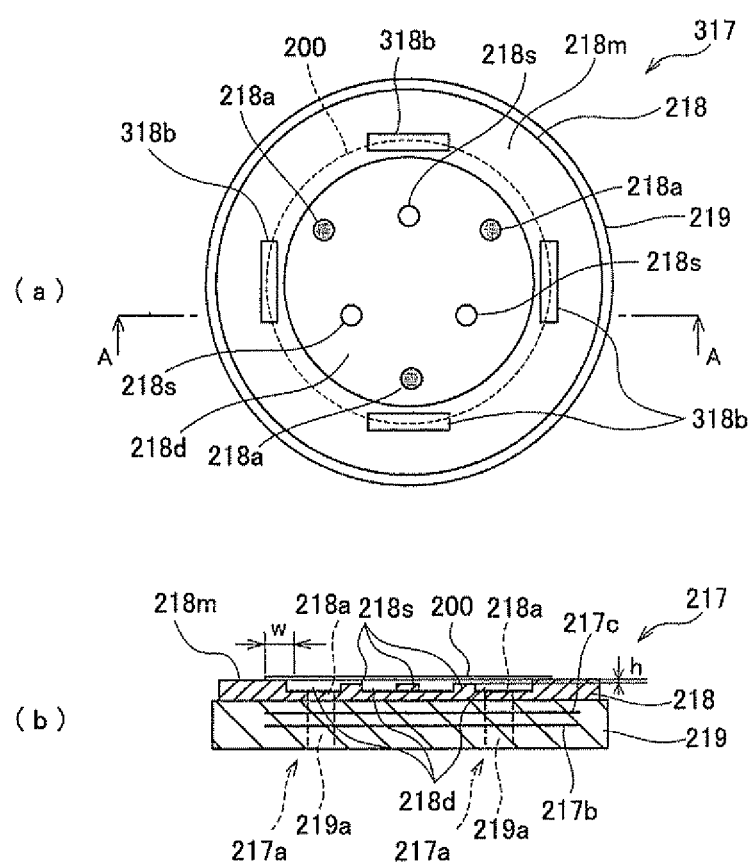

A modified example 1 of this embodiment will be described next using FIG. 6. As shown in FIG. 6A, one or more marks 318b showing support positions of the wafer 200 are provided on the upper surface of the substrate supporting member 317 of this example, in prescribed shape and arrangement. In an example shown in FIG. 6, linear marks 318b are provided at two places in a loading/unloading direction of the wafer 200 (in a direction of A-A axis), and at two places in a vertical direction to the loading/unloading direction. Each mark 318b has a prescribed thickness (width) and a length so as to be adequately visually confirmed.

The mark 318b can be formed by a method having a small influence on the wafer 200, such as providing incision, step, or protrusion on the surface of the susceptor cover 218. Further, by simultaneously performing the polishing finish of the susceptor cover 218, transparency of the susceptor cover 218 is increased, and visibility of the mark 318b can be improved. In this case, the mark may also be provided on the rear surface of the susceptor cover 218 to thereby avoid the influence on the wafer 200.

When the transport mechanism (not shown) provided in the MMT apparatus 100 is adjusted, as shown in FIG. 6A, by adjusting four edges caught in each mark 318b of the wafer 200 supported by the substrate supporting member 317 so as to enter in a prescribed width of each mark 318b, the wafer 200 can be loaded thereafter to a prescribed support position and is supported at this position. Thus, by providing the mark 318b, positional adjustment of the transport mechanism is facilitated, thus improving a position accuracy of transport, and the positional deviation of the wafer 200 can be suppressed. Accordingly, the contact between the wafer 200 and other member and a vibration, etc., added on the wafer 200 by this contact, are hardly generated, thus further reducing the particles.

Modified Example 2

Modified example 2 of this embodiment will be described next. The protruding area provided on the upper surface of the substrate supporting member of this example is configured to support the area away from the edge of the wafer 200 by 3 mm (closer to the center of the wafer 200). In order to support the wafer 200, when a certain film is formed on the wafer 200, there is a risk of generating particles by scraping a film of an edge portion of the wafer 200 which is caused by the protruding area touching on the edge of the wafer 200. However, as described above, with a structure that the position away from the edge of the wafer 200 by 3 mm or more is supported by the protruding area, the risk of touching on the edge of the wafer 200 can be reduced in supporting the wafer 200.

Second Embodiment of the Present Invention

In the aforementioned embodiment, explanation is given for the case of using the MMT apparatus 100. However, the present invention is not limited thereto, and can also be implemented by using ICP (Inductively Coupled Plasma) type plasma processing apparatus (described as ICP apparatus 300 hereafter).

Figure 8:
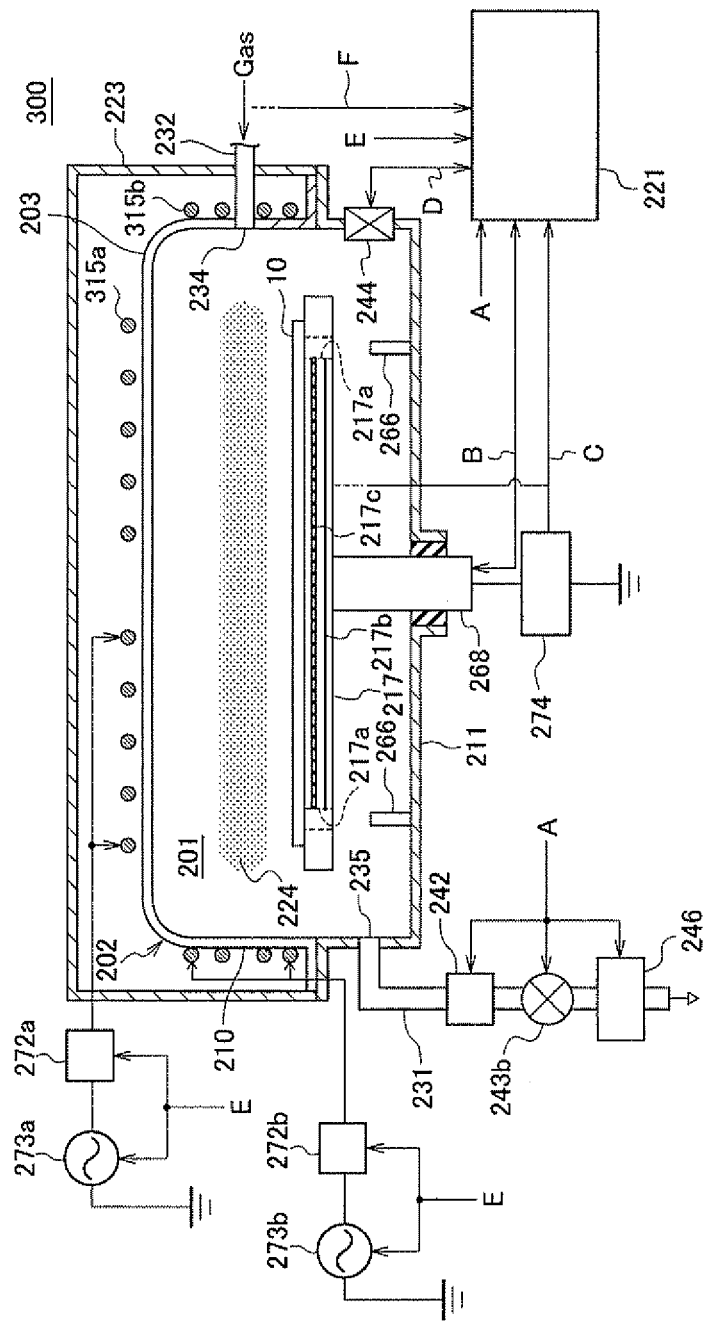
FIG. 8 is a cross-sectional view of an ICP-type plasma processing apparatus, being the substrate processing apparatus, according to a second embodiment of the present invention.

The ICP apparatus 300 according to this embodiment will be described hereafter using FIG. 8. The ICP apparatus 300 is different from the MMT apparatus 100 according to the aforementioned embodiment, mainly in the structure of the plasma generating section. The other structure is the same as the structure of the MMT apparatus 100. Note that in FIG. 8, a part of the structure such as the reaction gas supply section is simplified and shown.

The ICP apparatus 300 includes dielectric coils 315a, 315b for generating plasma by supplying electric power, as apart of the structure of the plasma generating section. The dielectric coil 315a is laid outside a ceiling wall of the upper side vessel 210. The dielectric coil 315b is laid outside the outer peripheral wall of the upper side vessel 210. The ICP apparatus 300 is also configured to supply the reaction gas into the processing chamber 201 through the gas introduction port 234. By supplying the reaction gas and applying high frequency power to the dielectric coils 315a, 315b, an approximately horizontal electric field is generated on the surface of the wafer 200 (processing surface) by electromagnetic induction. Plasma discharge is caused using this electric field as energy, to thereby generate reactive species by exciting the supplied reaction gas.

In this structure, strength of a vertical component and a horizontal component in the electric field added on the wafer 200 can be adjusted by controlling the high frequency power applied to the dielectric coils 315a, 315b, and impedance of the impedance variable mechanism 274. Particularly, the electric field in a horizontal direction can be easily strengthened by the dielectric coil 315b. Further, instead of the dielectric coil 315b, for example a cylinder-shaped cylindrical electrode or a parallel-board-type electrode, etc., may also be used.

The plasma generating section according to this embodiment is mainly composed of the dielectric coils 315a, 315b, the matchers 272a, 272b, and the high frequency power sources 273a, 273b.

In this embodiment as well, the effect similar to the effect of the aforementioned embodiment is exhibited.

Third Embodiment of the Present Invention

Further, in the aforementioned embodiment, explanation is given for a case of using the MMT apparatus 100 and the ICP apparatus 300. However, the present invention is not limited thereto, and can be implemented by using ECR (Electron Cyclotron Resonance) type plasma processing apparatus (described as ECR apparatus 400 hereafter).

Figure 9:
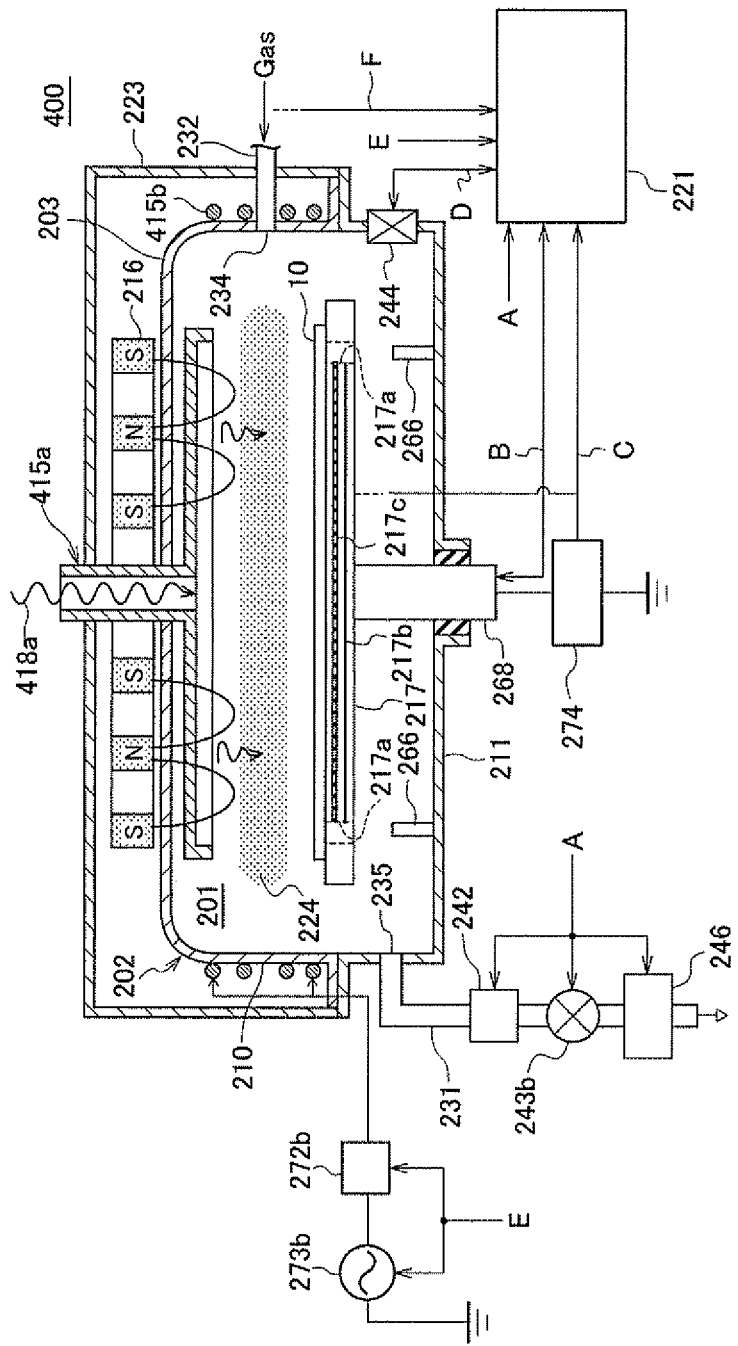
FIG. 9 is a cross-sectional view of an ECR-type plasma processing apparatus, being the substrate processing apparatus, according to a third embodiment of the present invention.

The ECR apparatus 400 according to this embodiment will be described hereafter using FIG. 9. The ECR apparatus 400 is different from the MMT apparatus 100 according to the aforementioned embodiment, mainly in the structure of the plasma generating section. The other structure is the same as the structure of the MMT apparatus 100. Note that in FIG. 9, a part of the structure such as the reaction gas supply section is simplified and shown.

The ECR apparatus 400 includes a microwave introduction tube 415a and a dielectric coil 415b, as apart of the structure of the plasma generating section. The microwave introduction tube 415a is laid outside of the ceiling wall of the upper side vessel 210, and is configured to supply microwave 418a and generate plasma. The dielectric coil 415b is laid outside an outer peripheral wall of the upper side vessel 210, and is configured to supply electric power and generate plasma. The ECR apparatus 400 is also configured to supply the reaction gas into the processing chamber 201 through the gas introduction port 234. When the reaction gas is supplied and the microwave 418a is introduced to the microwave introduction tube 415a, the microwave 418a is radiated to the processing chamber 201, to thereby form the electric field approximately vertical to an advancing direction of the microwave 418a, namely, approximately horizontal to the surface of the wafer 200 (processing surface). Further, by applying the high frequency power to the dielectric coil 415b, the electric field approximately horizontal to the processing surface of the wafer 200 is generated. Thus, plasma discharge is caused using this electric field as energy, the electric field being formed by the microwave 418*a* and the dielectric coil 415*b*, to thereby generate reactive species by exciting the supplied reaction gas.

In this structure, the strength of the vertical component and the horizontal component in the electric field added on the wafer 200 can be adjusted by controlling the strength of the introduced microwave 418*a* and the high frequency power applied to the dielectric coil 415*b*, and the impedance of the impedance variable mechanism 274. Particularly, the electric field in the horizontal direction to the processing surface of the wafer 200 can be easily strengthened by the dielectric coil 415*b*. Further, instead of the dielectric coil 415*b*, for example a cylinder-shaped cylindrical electrode or the parallel-board-type electrode, etc., may also be used.

Note that it is also acceptable that the microwave introduction tube 415*a* is provided on the side wall portion of the upper side vessel 210, and the microwave 418*a* is radiated approximately horizontally to the surface of the wafer 200. With this structure, a direction of the electric field can be further easily controlled, vertically to the processing surface of the wafer 200.

The plasma generating section according to this embodiment is mainly constituted of the microwave introduction tube 415*a*, the dielectric coil 415*b*, the matcher 272*b*, the high frequency power source 273*b*, and the magnet 216.

In this embodiment as well, the effect similar to the effect of the aforementioned embodiment can be exhibited.

Other Embodiment of the Present Invention

As described above, embodiments of the present invention are described specifically. However, the present invention is not limited to the aforementioned embodiments, and can be variously modified in a range not departing from the gist of the invention.

For example, in the aforementioned embodiments, the substrate supporting member 217 has the susceptor cover 218 attachable and detachable to/from the susceptor 218. However, the substrate supporting member may also be configured by forming the protruding area, the recessed area, and the auxiliary protruding area, etc., integrally with the susceptor by various techniques such as cut-out of the surface of the susceptor or bonding, etc., to the surface of the susceptor. In the structure of providing the susceptor cover 218 as a separate body, a prescribed thickness is required in consideration of a handling strength, etc. However, the whole body can be further thinly formed in a case of an integrated type. Therefore, the temperature rising speed can be improved by reducing a distance from the heater 217*b*, or the substrate processing can be performed at a higher temperature. Further, a drawing strength of electrically charged particles to the wafer 200 can be increased by reducing a distance from the impedance adjusting electrode 217*c*.

Further, in the aforementioned embodiments, the substrate supporting member 217 is made of quartz. However, it may also be made of aluminum nitride (AlN) or a non-metal material such as ceramics. It is also acceptable that the susceptor 219 and the susceptor cover 218 are made of different materials.

Further, in the aforementioned embodiments, the edge side of the wafer 200 is continuously supported by the outer peripheral supporting member 218*m*. However, grooves, being one or a plurality of flow passages, directing to the outside of the wafer 200 may be formed on the outer peripheral supporting member instead of the through holes 217*a* or in addition to the through holes 217*a*. At that time, the groove is preferably formed in a narrow shape by adjusting a width, etc., so that spread of plasma to the rear surface of the wafer 200 can be suppressed.

Further, in the aforementioned embodiment, the substrate supporting member 217 has the outer peripheral supporting member 218*m*, the central depressed portion 218*d*, the central supporting member 218*s*, and the through holes 217*a*. However, the shape and the structure of the substrate supporting member are not limited thereto. For example, the protruding area and the recessed area can be arranged in a matrix form, and a plurality of dot-shaped protruding areas can be arranged. The flow passages can also be formed in the through holes or grooves, and other mesh-shaped body or a porous body. The auxiliary protruding area having a circular or a rectangular supporting surface can be disposed, or the auxiliary protruding area may not be provided, so as to be suited to the aforementioned various aspects.

Further, in the aforementioned embodiment, the mark 218*b* formed in the susceptor cover 218 has a linear shape. However, the other shape such as curve-shape, L-shape, U-shape, or circle, elliptic shape, and polygonal shape may also be acceptable.

Further, in the aforementioned embodiment, the wafer 200 is held by the wafer upthrust pins 266 in the preheating step. However, the other system may also be used, provided that it is the system capable of holding the wafer 200 so as to be away from the substrate supporting member 217 by a prescribed distance.

Further, in the aforementioned embodiment, $N_2$ gas is selected as the boosting gas used in the preheating step. However, the boosting gas is not limited thereto, and $O_2$ gas and hydrogen ($H_2$) gas, and rare gas such as argon (Ar) gas, helium (He) gas, krypton (Kr) gas, can be used.

Further, the present invention can be applied not only to the aforementioned nitriding process, but also to a process of oxidizing, oxynitriding of performing oxidizing and nitriding together, diffusing, etching, and annealing, which are applied to a bare wafer or the wafer with each kind of film formed thereon. The processing can be performed by plasma, or not by plasma.

Further, the wafer 200 is heated by the heater 217*b* in the process after the preheating step. However, the lamp heating unit 280 can also be used together. Thus, the wafer 200 can be speedily heated and can be set to a further high temperature. Thus, by speedily heating the wafer 200 and setting it in a high temperature state, expansion of the wafer 200 is increased, thereby increasing the bending of the wafer 200, and increasing a length of rubbing between the substrate supporting member and the wafer upthrust pins 266 supporting the wafer 200. By such a phenomenon, it appears that a size of the scratch formed on the rear surface of the wafer 200 and an amount of the particles generated by rubbing, are increased. However, the size of the scratch formed on the rear surface of the wafer 200 and the amount of the particles can be reduced, by having the structure of the substrate supporting member 217 as shown in the aforementioned embodiments. Further, by adjusting an output of the lamp heating unit 280 and an output of the heater 217*b*, a temperature difference between the front surface and the rear surface of the wafer 200 can be reduced, and by reducing the bending and warpage of the wafer 200, the generation of particles caused by deviation of the wafer 200 can be reduced.

Further, in the aforementioned embodiments, the diameter of the wafer 200 is set to 300 mm. However, the present invention is not limited thereto, and the substrate supporting member supporting the wafer with a diameter of 450 mm is also acceptable. As the wafer becomes larger, layers of the gas between the substrate supporting member and the wafer is increased when the wafer is placed on the substrate supporting member, thus causing a large sliding sideways to occur. Further, extension of the wafer during expanding becomes longer at a position away from the center of the wafer, and therefore the amount of rubbing between the rear surface of the wafer and the substrate supporting member is increased, thus increasing the generation of scratches or particles. However, by forming the substrate supporting member similarly to the aforementioned embodiments, the sliding amount of the wafer and the scratches formed on the rear surface of the wafer, and generation of the particles can be suppressed.

EXAMPLES

Example 1

First, example 1 of the present invention will be described together with a comparative example. In this example, wafers were processed by the MMT apparatus including the substrate supporting member similar to the aforementioned embodiment, and the number of particles on the rear surface was measured. At this time, experiment was performed by setting the central supporting member lower than the outer peripheral supporting member by 0.2 mm, and setting the diameter of the surface of the central supporting member to 1.8 mm and 3 mm for supporting the wafer. Namely, total sum of the areas of three central supporting members is about 8 mm² and about 21 mm². Also, the number of particles on the rear surface of the wafer was measured, on the conventional wafer processed by the MMT apparatus including the substrate supporting member having approximately a flat upper surface, as the comparative example. The size of the particles is 0.15 μm in this example (having a diameter of 1.8 mm and 3 mm), and is 0.3 μm in the comparative example.

As a result of the measurement, the number of the particles was 46 when the diameter of the central supporting member is 1.8 mm, and the number of the particles was 357 in a case of the wafer having the diameter of 3 mm, and the number of particles was 5000 to 20000 in a case of the wafer using the substrate supporting member of the comparative example, respectively. From this measurement, it was found that the particles on the rear surface of the wafer could be reduced in this example in which the contact area between the substrate supporting member and the wafer was reduced, compared with the comparative example in which the wafer was supported by approximately the whole surface. Further, it was found that the particles were more reduced, in a case of a smaller diameter of the central supporting member.

From the aforementioned result, an upper limit of the diameter of the central supporting member satisfying an arbitrary requirement specification can be calculated. Namely, the following linear approximate equation can be obtained from measurement values at two points of the aforementioned diameters:1.8 mm and 3 mm.

$$y=259.17x-420.5 \quad (1)$$

wherein x is the diameter of the surface of the central supporting member supporting the wafer, and y is the number of particles on the rear surface of the wafer.

A theoretical value of satisfying the requirement specification was obtained, if the diameter x of the surface of the central supporting member supporting the wafer was smaller than about 2.8 mm, based on the aforementioned equation (1) on the assumption that the requirement specification of the number y of the particles was less than 300.

Example 2

Example 2 of the present invention will be described next, together with the comparative example. The substrate supporting member of this example has marks showing the support positions of the wafer with a width of 1.5 mm, a length of 40 mm, and a position accuracy of ±0.5 mm at four places, with surface roughness Ra of 0.1 μm by polishing finish. Meanwhile, the substrate supporting member of the comparative example does not have the marks, with surface roughness Ra of 2.5 μm with no polishing finish applied thereto, with its upper surface formed in approximately a flat surface. The wafer is processed by the MMT apparatus including each substrate supporting member, and the number of the particles on the surface of the wafer was measured. The measured size of the particles was 0.15 μm.

As a result, it was found that the number of the particles was about 10 in this example, and was about 100 in the comparative example. Therefore, it was found that the particles on the surface of the wafer could be reduced by increasing the transport accuracy by the marks showing the support positions of the wafer.

Example 3

Next, the temperature rising characteristic of each wafer in the preheating step was measured by the MMT apparatus including each substrate supporting member, using the substrate supporting member with its center supporting member formed lower than the outer peripheral supporting member by 0.1 mm as example 3, and using the substrate supporting member with its upper surface formed in approximately a flat surface as the comparative example.

Figure 7:
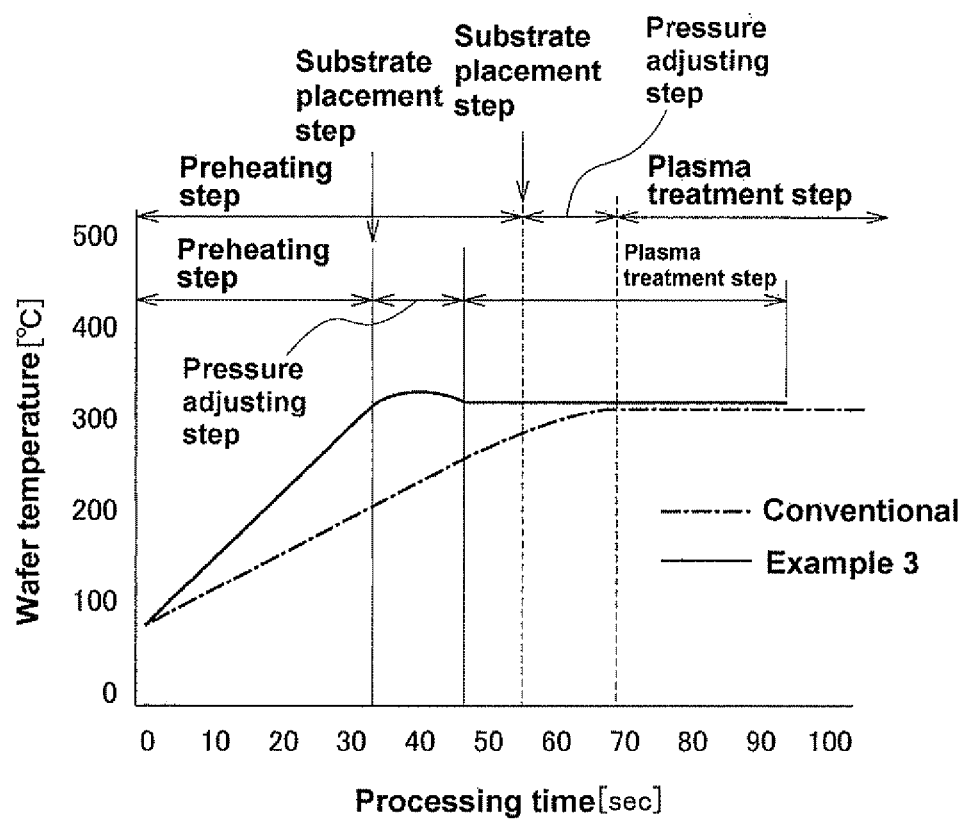

FIG. 7A shows an event chart corresponding to a flow of the substrate processing applied to each wafer, together with the implementation time of each event. The left side on the paper face shows data of the wafer of this example, and the right side on the paper face shows data of the wafer of the comparative example. The substrate processing applied to each wafer undergoes preheating step (No. 1:PE-UP) substrate placement step, pressure adjusting step (No. 2:APC-SET, No. 3:PRESET), and plasma treatment step (No. 4:IGNITION, No. 5:NITRIDATION), to thereby end the process (No. 6:PE-DOWN, No. 7:END).

In the preheating step, the data of this example was obtained by holding the wafer separated from the substrate supporting member of this example (g1=0.5 mm to 1.0 mm based on FIG. 5A) in a high pressure sate of 400 Pa in the processing chamber, and by raising the temperature close to 300° C., being a target temperature. Meanwhile, the data of the comparative example was obtained by holding the wafer separated from the substrate supporting member of the comparative example (g2=2.0 mm based on FIG. 5B) in a high pressure state of 100 Pa in the processing chamber, and by raising the temperature close to 300° C.

Time, 55 seconds, are required for the preheating step (No. 1:PE-UP) according to the comparative example, and meanwhile the time is shortened to 33 seconds according to this example. This is shown in the graph of FIG. 7B. In FIG. 7B, the processing time (sec) of the wafer is taken on the horizontal axis, and the wafer temperature (° C.) is taken on the vertical axis. In the figure, temperature rising data of the wafer according to this example is shown by solid line, and temperature rising data of the wafer according to the comparative example is shown by one dot chain line.

As shown in FIG. 7B, the temperature was raised suddenly in the preheating step in the wafer of this example compared with the wafer of the comparative example, and it was found that the temperature rising speed was improved by increasing the pressure in the processing chamber more than the wafer of the comparative example. Then, the throughputs of the example and the comparative example were measured under the aforementioned condition, and it was found that a maximum throughput was 34/h in the example, and a maximum throughput was 29/h in the comparative example.

Example 4

Next, in example 4, the throughputs of the example and the comparative example were measured respectively, using the substrate supporting member similar to that of the example 3, and using the substrate supporting member as the comparative example, which was similar to the comparative example of the aforementioned example 3, in a case that the preheating step was not performed. The pressure in the processing chamber immediately after loading the wafer from the vacuum transport chamber was about 100 Pa which was approximately the same pressure as the pressure in the vacuum transport chamber. The wafer of this example was placed on the substrate supporting member of this example, with the pressure in the processing chamber set to 100 Pa, after being loaded into the processing chamber. Meanwhile, the wafer of the comparative example was placed on the substrate supporting member of the comparative example, with the pressure in the processing chamber set to 30 Pa, after being loaded into the processing chamber and exhausting the atmosphere in the processing chamber once to suppress the sliding of the wafer sideways.

As a result, it was found that in the comparative example, the processing time required for processing one wafer was 90 seconds, and the throughput was 40/h. Meanwhile, in the example, the processing time required for processing one wafer was shortened to 85 seconds, and the throughput was improved to 42/h. As described above, it was found that the throughput was improved by using the substrate supporting member capable of suppressing the sliding of the wafer sideways, even in a case of a different flow of the substrate processing.

Note that in the substrate supporting member according to examples 1 to 4, it was confirmed that sliding of the wafer sideways was not generated even under the atmospheric pressure.

<Preferable Aspects of the Present Invention>

Preferable aspects of the present invention will be supplementarily described hereafter.

According to an aspect of the present invention, there is provided a substrate processing apparatus, comprising:

a processing chamber configured to process a substrate;

a substrate supporting member provided in the processing chamber and configured to support the substrate;

a gas supply section configured to supply processing gas into the processing chamber;

a gas exhaust section configured to exhaust inside of the processing chamber;

a plasma generating section configured to excite the processing gas supplied into the processing chamber; and a controller configured to control the gas supply section, the gas exhaust section, and the plasma generating section.

wherein the substrate supporting member has on its upper surface, a protruding area for supporting a part of the substrate from below, and a recessed area disposed so as not to be brought into contact with the substrate supported by the protruding area, and a flow passage communicated into the recessed area, for flowing a gas between the substrate and the substrate supporting member from the recessed area side.

Preferably, the protruding area supports an edge side of the substrate, and the recessed area is provided inside of the protruding area.

Further preferably, the protruding area supports an area of less than 3 mm to inside from the edge of the substrate.

Further preferably, the protruding area supports only a bottom edge side of the substrate, so as not to be brought into contact with a side portion of the substrate.

Further preferably, an upper surface of the protruding area is formed in a flat shape.

Further preferably, the recessed area has an auxiliary protruding area for auxiliarily supporting a part of the substrate from below.

Further preferably, the auxiliary protruding area is formed lower than the protruding area.

Further preferably, the auxiliary protruding area is formed lower than the protruding area by 0.1 mm or more and 0.2 mm or less.

Further preferably, a diameter of a surface of the auxiliary protruding area for supporting the substrate is smaller than 2.8 mm.

Further preferably, a plurality of auxiliary protruding areas are provided.

Further preferably, three or more auxiliary protruding areas are provided.

Further preferably, the auxiliary protruding area is provided in an area excluding a center of the substrate.

Further preferably, the auxiliary protruding area is provided in an area excluding a center of the recessed area.

Further preferably, surface roughness Ra of the protruding area is smaller than 2.5 μm.

Further preferably, the substrate supporting member has marks showing support positions of the substrate on an upper surface.

Further preferably, the substrate supporting member has a susceptor and a susceptor cover attachable and detachable to/from the susceptor, and the protruding area and the recessed area are provided on the susceptor cover.

According to other aspect of the present invention, there is provided a method for manufacturing a semiconductor device, comprising:

loading a substrate into a processing chamber;

placing the substrate on a substrate supporting member provided in the processing chamber, for supporting the substrate;

plasma-processing the substrate by supplying processing gas into the processing chamber by a gas supply section while exhausting inside of the processing chamber by a gas exhaust section, and exciting processing gas supplied into the processing chamber by a plasma generating section; and unloading the substrate from the processing chamber, wherein in placing the substrate on the substrate supporting member, the substrate is placed in a protruding area that supports a part of the substrate from below on an upper surface of the substrate supporting member, so that the substrate is not brought into contact with a recessed area, while escaping a gas between the substrate and the substrate supporting member to a flow passage communicated with the recessed area on the upper surface of the substrate supporting member.

Preferably, there is provided a preheating step before placing the substrate on the substrate supporting member, for preheating the substrate held in such a manner as being away from the protruding area, by a heating section provided in the substrate supporting member, in a high pressure state in the processing chamber, wherein placing the substrate on the substrate supporting member is implemented after heating the substrate to a prescribed temperature, in a higher pressure state than 100 pa in the processing chamber.

Further preferably, the substrate supporting member has a susceptor and a susceptor cover covering the susceptor, and the protruding area, the recessed area, and the auxiliary protruding area are provided on the susceptor cover.

Further preferably, a diameter of a surface of the auxiliary protruding area for supporting the substrate is smaller than 2.8 mm.

Further preferably, three or more auxiliary protruding areas are provided.

Further preferably, the auxiliary protruding area is provided in an area excluding a center of the recessed area.

According to further other aspect of the present invention, there is provided a method for processing a substrate, comprising:

loading a substrate into a processing chamber;

placing the substrate on a substrate supporting member while escaping a gas between the substrate and the substrate supporting member to a flow passage communicated with a recessed area, the substrate supporting member being provided in the processing chamber and having on its upper surface, a protruding area for supporting an edge side of the substrate from below and the recessed area provided inside of the protruding area so as not to be brought into contact with the substrate supported by the protruding area, and an auxiliary protruding area formed lower than the protruding area and provided in the recessed area;

supplying processing gas into the processing chamber by a gas supply section while exhausting the inside of the processing chamber by a gas exhaust section, and plasma-processing the substrate by exciting the processing gas supplied into the processing chamber, by a plasma generating section; and unloading the substrate from the processing chamber.

According to a further other aspect of the present invention, there is provided a susceptor cover attachable and detachable to/from the suceptor that supports a substrate in a processing chamber for processing the substrate, comprising thereon a protruding area supporting a part of the substrate from below, and a recessed area disposed so as not to be brought into contact with the substrate supported by the protruding area.

Further preferably, a diameter of a surface of the auxiliary protruding area for supporting the substrate is smaller than 2.8 mm.

Further preferably, three or more auxiliary protruding areas are provided.

Further preferably, the auxiliary protruding area is provided in an area excluding a center of the recessed area.

According to further other aspect of the present invention, there is provided a substrate supporting member provided in a processing chamber for processing a substrate, and configured to support the substrate, having on an upper surface, a protruding area that supports a part of the substrate from below, a recessed area disposed so as not to be brought into contact with the substrate supported by the protruding area, and an auxiliary protruding area formed lower than the protruding area and provided in the recessed area.

Further preferably, there is provided a flow passage that communicates with inside of the recessed area, for flowing a gas between the substrate and the substrate supporting member from the recessed area side.

According to further other aspect of the present invention, there is provided a substrate processing apparatus, comprising:

a processing chamber configured to process a substrate;

a substrate supporting member having a protruding area provided in the processing chamber so as to be brought into contact with the substrate and supporting an edge side of the substrate, and an auxiliary protruding area provided in the processing chamber and supporting a center side of the substrate at a position lower than the protruding area;

a gas supply section configured to supply processing gas into the processing chamber;

a gas exhaust section configured to exhaust inside of the processing chamber;

a plasma generating section configured to excite the processing gas supplied into the processing chamber; and a controller configured to control the gas supply section, the gas exhaust section, and the plasma generating section.

What is claimed is:

1. A substrate processing apparatus comprising:
a processing chamber configured to process a substrate;
a substrate supporting member provided in the processing chamber, the substrate supporting member being configured to support the substrate;
a gas supply section configured to supply processing gas into the processing chamber;
a gas exhaust section configured to exhaust an inside of the processing chamber;
a plasma generating section configured to excite the processing gas supplied into the processing chamber;
a controller configured to control the gas supply section, the gas exhaust section, and the plasma generating section;
and a substrate upthrust pin that temporarily holds the substrate, wherein
the substrate supporting member includes a susceptor, and a susceptor cover covering the susceptor,
the susceptor has a heating section inside, the heating section being configured to heat the substrate,
the susceptor cover has a thickness range from 0.7 mm to 1.5 mm,
the susceptor cover is provided separately from the susceptor, the susceptor cover being attachable and detachable to/from the susceptor,
the susceptor cover has an upper surface that includes:
a protruding area that continuously supports an outer peripheral edge of the substrate so as to surround the substrate from below;
a recessed area that is provided inside of the protruding area so as not to be brought into contact with the substrate supported by the protruding area;
and a plurality of auxiliary protruding areas that are formed below the protruding area, the plurality of auxiliary protruding areas being provided in the recessed area on a first circle concentric with the outer peripheral edge of the substrate supporting member;
and a plurality of through-holes, each of the plurality of through-holes being configured to communicate into the recessed area, and to allow a gas between the substrate and the substrate supporting member to escape from the recessed area side, the plurality of through-holes being provided at different positions than the plurality of auxiliary protruding areas, and on a second circle concentric with the outer peripheral edge of the substrate supporting member, the plurality of through holes are provided in the susceptor and susceptor cover, and the substrate upthrust pin is configured to (i) be inserted into a corresponding one of the plurality of through-holes, and (ii) temporarily hold the substrate above the substrate supporting member via the corresponding one of the plurality of through-holes;

wherein the susceptor has an impedance adjusting electrode inside.

2. The substrate processing apparatus according to claim 1, wherein a diameter of a surface of each of the plurality of auxiliary protruding areas is smaller than 2.8 mm.

3. The substrate processing apparatus according to claim 1, wherein the plurality of auxiliary protruding areas includes three or more auxiliary protruding areas.

4. The substrate processing apparatus according to claim 1, further comprising a substrate elevation mechanism configured to elevate the substrate by the substrate upthrust pin, wherein the controller is configured to control the substrate elevation mechanism, the gas supply section and the gas exhaust section to set a pressure inside of the processing chamber to higher than 100 Pa when the substrate upthrust pin temporarily holds the substrate above the substrate supporting member, and thereafter place the substrate on the protruding area from the substrate upthrust pin.

5. The substrate processing apparatus according to claim 1, wherein each of the auxiliary protruding areas is in a cylindrical shape.

6. The substrate processing apparatus according to claim 1, wherein each of the protruding area and the plurality of auxiliary protruding areas has a supporting surface supporting the substrate, the supporting surface being a mirror surface.

7. The substrate processing apparatus according to claim 1, wherein the plurality of auxiliary protruding areas are provided in a portion of the recessed area excluding a center of the recessed area.

8. The substrate processing apparatus according to claim 1, further comprising a substrate elevation mechanism configured to elevate the substrate by the substrate upthrust pin, wherein the controller is configured to control the substrate elevation mechanism and the heating section to (i) preheat the substrate with the heating section for a predetermined time when the substrate upthrust pin temporarily holds the substrate above the substrate supporting member, and (ii) heat the substrate by the heating section by placing the substrate on the protruding area after the predetermined time.

9. The substrate processing apparatus according to claim 1, wherein the plurality of through holes are opened at a bottom of the recessed area.

10. The substrate processing apparatus according to claim 9, wherein the plurality of auxiliary protruding areas auxiliarily support the substrate so that the substrate does not block the plurality of through holes.

11. The substrate processing apparatus according to claim 1, wherein the plurality of auxiliary protruding areas are not provided in a region excluding the first concentric circle, and the plurality of through holes are disposed radially outside an outermost periphery of the first concentric circle.

12. The substrate processing apparatus according to claim 1, further comprising a lamp heating unit configured to heat the substrate, the lamp heating unit being provided outside of the processing chamber.

13. The substrate processing apparatus according to claim 1, further comprising an impedance variable mechanism.

14. The substrate processing apparatus according to claim 1, wherein the substrate supporting member is configured to support the substrate without electrostatic chucking.

* * * * *